United States Patent
Tsai

(10) Patent No.: US 8,302,297 B2
(45) Date of Patent: Nov. 6, 2012

(54) METHOD OF FABRICATING A CIRCUIT BOARD STRUCTURE

(75) Inventor: Kun-Chen Tsai, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 199 days.

(21) Appl. No.: 12/649,501

(22) Filed: Dec. 30, 2009

(65) Prior Publication Data
US 2010/0187003 A1 Jul. 29, 2010

(30) Foreign Application Priority Data
Jan. 23, 2009 (TW) .............................. 98102773 A

(51) Int. Cl.
*H01K 3/10* (2006.01)
(52) U.S. Cl. ............ 29/852; 29/831; 174/262; 427/98.4
(58) Field of Classification Search .................. 174/255, 174/261–263; 427/97.1, 98.4; 438/584, 438/612, 613, 652, 678; 29/830, 831, 846–849, 29/851, 852
See application file for complete search history.

(56) References Cited

U.S. PATENT DOCUMENTS

| | | | |
|---|---|---|---|
| 7,435,680 B2 * | 10/2008 | Nakamura et al. | 438/678 |
| 7,820,233 B2 * | 10/2010 | Chen et al. | 427/97.1 |
| 2003/0177635 A1 | 9/2003 | Arrington et al. | |
| 2008/0075836 A1 | 3/2008 | Chen et al. | |
| 2008/0223605 A1 | 9/2008 | Chen et al. | |

* cited by examiner

*Primary Examiner* — Donghai D. Nguyen
(74) *Attorney, Agent, or Firm* — Peter F. Corless; Steven M. Jensen; Edwards Wildman Palmer LLP

(57) ABSTRACT

Provided are a circuit board structure and a fabrication method thereof, including the steps of: forming a first circuit layer in a first dielectric layer and exposing the first circuit layer therefrom; forming a second dielectric layer on the first dielectric layer and the first circuit layer, and forming a second circuit layer on the second dielectric layer; forming a plurality of first conductive vias in the second dielectric layer for electrically connecting to the first circuit layer to thereby dispense with a core board and electroplated holes and thus facilitate miniaturization. Further, the first dielectric layer is liquid before being hardened and is formed on the first dielectric layer that enhances the bonding between layers of the circuit board and the structure.

13 Claims, 9 Drawing Sheets

METHOD OF FABRICATING A CIRCUIT BOARD STRUCTURE

CROSS-REFERENCES TO RELATED APPLICATIONS

This application claims under 35 U.S.C. §119(a) the benefit of Taiwanese Application No. 098102773 filed Jan. 23, 2009 the entire contents of which is incorporated herein by reference.

BACKGROUND OF THE INVENTION

1. Field of the Invention

The present invention relates to circuit board structures and fabrication methods thereof, and more particularly, to a circuit board structure without a core and a fabrication method thereof.

2. Description of Related Art

As electronic industry is ever-developing, a multilayer circuit board having a plurality of active elements, passive elements and circuits is provided to meet requirements of packaging for high integration and microminiaturization of a semiconductor package. More usable layout space of the multilayer circuit board in a limited area is obtained by inter-layer connection technology so as to satisfy the requirements of high density of integrated circuit. A build-up method is disclosed in prior art to improve precision of the layout of a multilayer circuit board. The method comprises the steps of: Providing a core board having a plurality of inner circuit layers on the upper side and the lower side of the core board and conductive holes through the core board to connect electrically the inner circuit layers; stacking a plurality of dielectric layers and circuit layers alternately on upper and lower surfaces of the core board and forming conductive vias in the dielectric layers to establish electrical connection between the circuit layers.

Referring to FIG. 1A to FIG. 1H, there are shown schematic views of a process of fabricating a multiplayer circuit board according to the prior art.

As shown in FIG. 1A, a copper-coated laminated (CCL) core 100 with metallic thin layers 101 is provided, and a plurality of holes 102 are formed in the core 100 by drilling.

As shown in FIG. 1B, metallic layers 103 are formed on the surface of the metallic thin layers 101 and walls of the holes 102.

As shown in FIG. 1C, plated-through holes (PTH) 102a are formed by filling the holes 102 with conducting or non-conducting stuffing materials 11, such as insulating ink, copper-containing conductive paste or the like, so as to enable electrical conduction between the upper and lower metallic layers 103 on the core 100.

As shown in FIG. 1D, the surfaces of the metallic layers 103 flatten out after a surplus portion of the stuffing material 11 has been removed by a scrubbing process.

As shown in FIG. 1E, a circuit patterning process is performed on the metallic thin layers 101 and the metallic layers 103 on the core 100, so as to finalize a substrate 10 with inner circuit layers 104 formed on two opposing sides of the substrate 10, respectively.

As shown in FIG. 1F, dielectric layers 12 are formed on the inner circuit layers 104 formed on upper and lower surfaces of the substrate 10, and a plurality of vias 120 are formed in the dielectric layers 12 by laser drilling.

As shown in FIG. 1G, conductive layers 13 are formed on the surface of the dielectric layers 12 and the vias 120. Resist layers 14 are formed on the conductive layers 13. Opening regions 140 which expose a portion of the conductive layers 13 to the outside are formed in the resist layers 14 to allow an electroplating process to be performed. Circuit layers 15 are formed on the conductive layers 13 exposed from the opening regions 140 by the electroplating process, and conductive vias 151 are formed in the vias 120 such that the circuit layers 15 are electrically connected to the inner circuit layers 104.

As shown in FIG. 1H, a multilayer circuit board is formed by removing the conductive layers 13 and the resist layers 14 thereon and repeating the steps of the formation of the dielectric layers and circuit layers of the FIG. 1F and FIG. 1G.

However, the manufacturing process of said multiplayer circuit board comprises the steps of providing the core 100 with the metallic thin layers 101 thereon, forming the plurality of plated-through holes 102a in the core 100, and forming the inner circuit layers 104 on the surface of the core 100 to thereby require operations, such as drilling, plugging, and scrubbing, which render the manufacturing process complicated.

In addition, the diameter of the plated-through holes 102a formed by circuit-electroplating in the substrate 10 is about 100 µm above and the diameter of the conductive vias 151 formed by circuit-electroplating in the dielectric layers 12 is around 50 µm. Therefore the structure of the plating-through holes 102a occupies more layout space than the conductive vias 151 to the detriment of formation of a fine-pitch circuit structure.

Moreover, the dielectric layers 12 are composed of prepreg. The dielectric layers 12 are formed on the fine-pitch inner circuit layers 104 of the substrate 10. However, it is difficult to stuff the prepreg into the space between the circuits in the inner circuit layers 104. Hence, the dielectric layers 12 are not each sufficiently bonded to the substrate 10 and thus gaps are created therebetween, and in consequence the dielectric layers 12 are detachable from the substrate 10 during a follow-up process.

Furthermore, the multilayer circuit board is unnecessarily thick to the detriment of miniaturization, because the core 100 occupies most of the substrate 10.

Therefore, it is imperative to provide a multilayer circuit board and a fabrication method thereof so as to overcome the above-described drawbacks, such as small layout density, the need for formation of the dielectric layers, and excessive thickness of the circuit board.

SUMMARY OF THE INVENTION

Accordingly, an objective of the present invention is to provide a circuit board and a method for fabricating the circuit board structure so as to dispense with a core board and thus facilitate miniaturization.

Another objective of the present invention is to provide a circuit board structure and a method for fabricating the same so as to stuff dielectric layers into a gap between circuits for preventing delamination of the circuit board structure.

Yet another objective of the present invention is to provide a circuit board structure and a method for fabricating the same so as to increase layout density of the circuit board.

In order to attain the above and other objectives, the present invention provides a first dielectric layer; a first circuit layer formed in the first dielectric layer and exposed from the surface of the first dielectric layer; a second dielectric layer formed on the first dielectric layer and the first circuit layer; and a second circuit layer formed on the second dielectric layer, wherein a plurality of first conductive vias are formed in the second dielectric layer so as to electrically connect to the first circuit layer.

In the above-described structure, further comprises a first solder mask formed on the first circuit layer and the second dielectric layer-free side of the first dielectric layer, wherein a plurality of openings are formed in the first solder mask so as to expose a portion of the first circuit layer to thereby allow the exposed portion of the first circuit layer to be formed into a plurality of first electrical connecting pads. In another embodiment, the circuit board structure further comprises a second solder mask formed on the third dielectric layer and the second circuit layer, and a plurality of openings are formed in the second solder mask so as to expose a portion of the second circuit layer to thereby allow the exposed portion of the second circuit layer to be formed into a plurality of second electrical connecting pads. In yet another embodiment, the circuit board structure further comprises a third dielectric layer formed on the surface of sides of the second dielectric layer and the second circuit layer, wherein the second circuit layer is exposed from the surface of the third dielectric layer, a second solder mask formed on the third dielectric layer and the second circuit layer, wherein a plurality of openings are formed in the second solder mask so as to expose a portion of the second circuit layer to thereby allow the exposed portion of the second circuit layer to be formed into a plurality of second electrical connecting pads.

In the above-described structure, further comprises a treatment layer formed on the first electrical connecting pads, wherein the treatment layer is made of tin (Sn), lead (Pb), silver (Ag), copper (Cu), zinc (Zn), bismuth (Bi), nickel (Ni), palladium (Pd), or gold (Au).

In another embodiment, the present invention further provides a circuit board structure comprising a build-up layer assembly formed on the third dielectric layer and the second circuit layer, wherein the build-up layer assembly includes at least a fourth dielectric layer, a third circuit layer and a fifth dielectric layer formed on the fourth dielectric layer, and a plurality of second conductive vias formed in the fourth dielectric layer and electrically connected to the second circuit layer and the third circuit layer, wherein a plurality of third electrical connecting pads are formed on the third circuit layer which is situated on an outermost part of the build-up layer assembly, and a solder mask is formed on the outermost part of the build-up layer assembly and the solder mask is further formed with a plurality of openings so as for the third electrical connecting pads to be exposed from the openings, respectively.

In the above-described structure, further comprises a treatment layer formed on the first electrical connecting pads and the third electrical connecting pads, wherein the treatment layer is made of tin (Sn), lead (Pb), silver (Ag), copper (Cu), zinc (Zn), bismuth (Bi), nickel (Ni), palladium (Pd), or gold (Au).

The present invention further provides a method for fabricating a circuit board, comprising the steps of: providing a carrier board; forming a first circuit layer on the surface of the carrier board; forming a first dielectric layer on the carrier board and the first circuit layer in a manner that the first circuit layer is exposed from the surface of the first dielectric layer; forming a second dielectric layer on the first circuit layer and the first dielectric layer; forming a second circuit layer on the second dielectric layer, and forming a first conductive via in the second dielectric layer so as to electrically connect to the first circuit layer; and removing the carrier board so as to expose the first dielectric layer and the first circuit layer.

In the above-described method, the fabricating process of forming the first circuit layer further comprising the steps of: forming a first conductive layer on the carrier board; forming a first resist layer on the first conductive layer, and forming a first opening region in the first resist layer; forming the first circuit layer in the first opening region; and removing the first conductive layer and the first resist layer thereon.

In the above-described method, the fabricating process of forming the second circuit layer further comprising the steps of: forming a metallic layer on the second dielectric layer; forming a plurality of vias to penetrate the second dielectric layer and the metallic layer; forming a second conductive layer on the first circuit layer of the metallic layer, the vias and walls of the vias; forming an electroplating metallic layer on the second conductive layer; forming a second resist layer on the electroplating metallic layer, followed by forming a plurality of second opening regions to penetrate the second resist layer so as to expose correspondingly the portion of the electroplating metallic layer; removing the second conductive layer, the metallic layer, and the electroplating metallic layer thereon in the second opening region to form the second circuit layer, and forming the first conductive via in the via; and removing the second resist layer.

In another embodiment, the step of forming the second circuit layer further comprises the sub-steps of: forming a metallic layer on the second dielectric layer; forming a plurality of vias to penetrate the second dielectric layer and the metallic layer; forming a second conductive layer on the first circuit layer of the metallic layer, the vias and walls of the vias; forming a second resist layer on the second conductive layer, followed by forming a plurality of second opening regions to penetrate the second resist layer so as to expose a portion of the electroplating metallic layer; forming a second resist layer on the electroplating metallic layer, followed by forming a plurality of second opening regions to penetrate the second resist layer so as to expose correspondingly the portion of the second conductive layer, wherein the portion of the second conductive layer corresponds to the via; forming the second circuit layer on the second conductive layer of the second opening region, and forming the first conductive via in the via; and removing the second conductive layer, metallic layer, and the resist layer thereon.

In the above-described method, further comprises the steps of: forming a first solder mask on the first circuit layer and the second dielectric layer-free side of the first dielectric layer, forming a plurality of openings in the first solder mask so as to expose a portion of the first circuit layer to thereby allow the exposed portion of the first circuit layer to be formed into a plurality of first electrical connecting pads; forming a second solder mask on the third dielectric layer and the second circuit layer, and forming a plurality of openings in the second solder mask so as to expose a portion of the second circuit layer to thereby allow the exposed portion of the second circuit layer to be formed into a plurality of second electrical connecting pads. In another embodiment, a third dielectric layer is formed on the surface of sides of the second dielectric layer and the second circuit layer such that the second circuit layer is exposed from the surface of the third dielectric layer. Then, a second solder mask is formed on the third dielectric layer and the second circuit layer, and a plurality of openings are formed in the second solder mask to expose portions of the second circuit layer so as for the exposed portions of the second circuit layer to function as a plurality of second electrical connecting pads, respectively.

In another embodiment, the method further comprises the step of forming a treatment layer on the second electrical connecting pads, wherein the treatment layer is made of tin (Sn), lead (Pb), silver (Ag), copper (Cu), zinc (Zn), bismuth (Bi), nickel (Ni), palladium (Pd), or gold (Au).

The above-described method further comprises the step of forming a build-up layer assembly on the third dielectric layer and the second circuit layer, wherein the build-up layer assembly includes at least a fourth dielectric layer, a third circuit layer and a fifth dielectric layer formed on the fourth dielectric layer, and a plurality of second conductive vias formed in the fourth dielectric layer and electrically connected to the second circuit layer and the third circuit layer, wherein a plurality of third electrical connecting pads are formed on the third circuit layer which is situated on an outermost part of the build-up layer assembly, and a solder mask is formed on the outermost part of the build-up layer assembly and the solder mask is further formed with a plurality of openings so as for the third electrical connecting pads to be exposed from the openings, respectively.

In another embodiment, the method further comprises the step of forming a treatment layer on the third electrical connecting pads, wherein the treatment layer is made of tin (Sn), lead (Pb), silver (Ag), copper (Cu), zinc (Zn), bismuth (Bi), nickel (Ni), palladium (Pd), or gold (Au).

In view of the above, the method of the present invention essentially comprises the steps of: forming the non-solidifying first dielectric layer on the upper and lower surface of the carrier board at first, stuffing the first dielectric layer into the gap of the first circuit layer to expose the first circuit layer from the first dielectric layer, forming a second dielectric layer with prepreg on the first dielectric layer and the first circuit layer to embed the rough surface of the second dielectric layer in the non-solidifying first dielectric layer, and solidifying the first dielectric layer and the second dielectric layer so as to enhance bonding strength and prevent delamination, then forming a second circuit layer on the second dielectric layer, forming a first conductive via in the second dielectric layer to electrically connect to the first circuit layer, and removing the carrier board to form a circuit board structure. Therefore, the present invention discloses using a circuit board structure without a known thick core occupying the conductive holes so as to increase the layout density and decrease the thickness of the circuit board structure. Furthermore, the present invention overcomes the problems confronting the prior art, that is, it is difficult to stuff a dielectric layer into gaps between circuit layers of a conventional circuit board with a high layout density, which precludes fabrication of conventional circuit boards with high layout density.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

Figure 1A:
FIGS. 1A to 1H are schematic views of a conventional flip-chip circuit board structure.
Figure 1B:
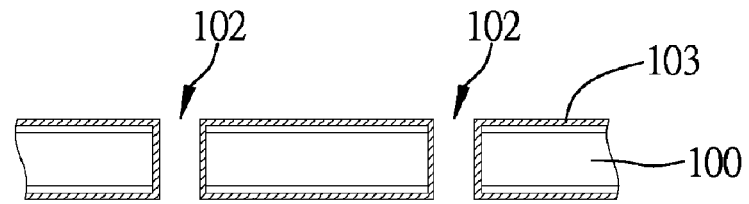
Figure 1C:
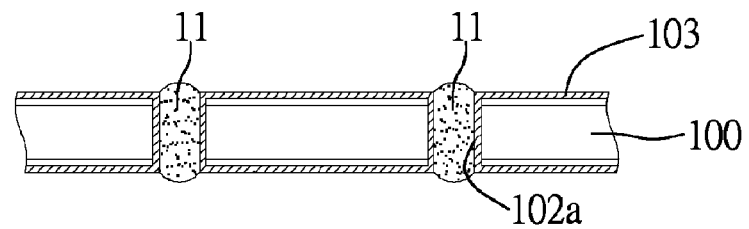
Figure 1D:
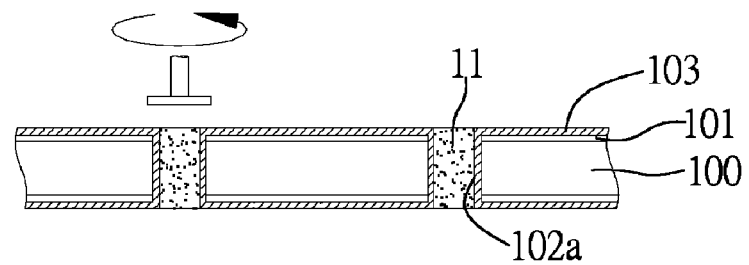
Figure 1E:
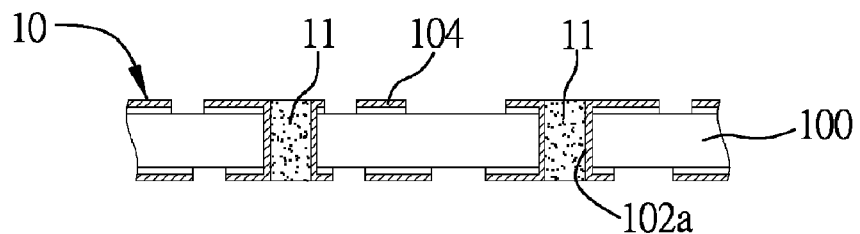
Figure 1F:
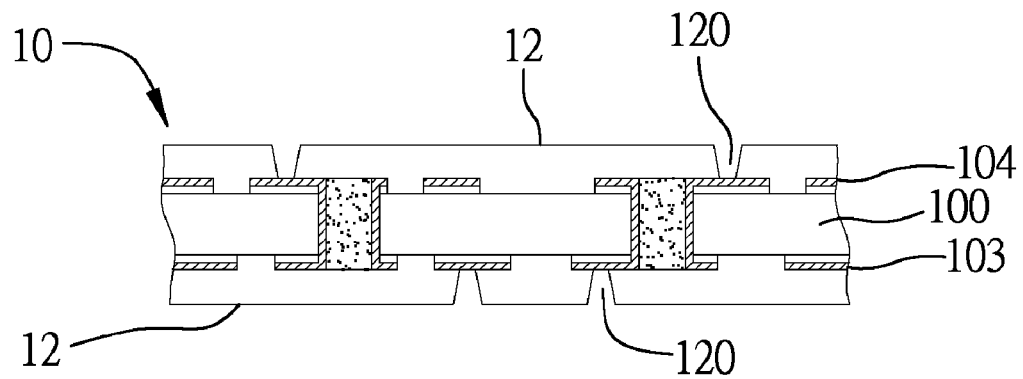
Figure 1G:
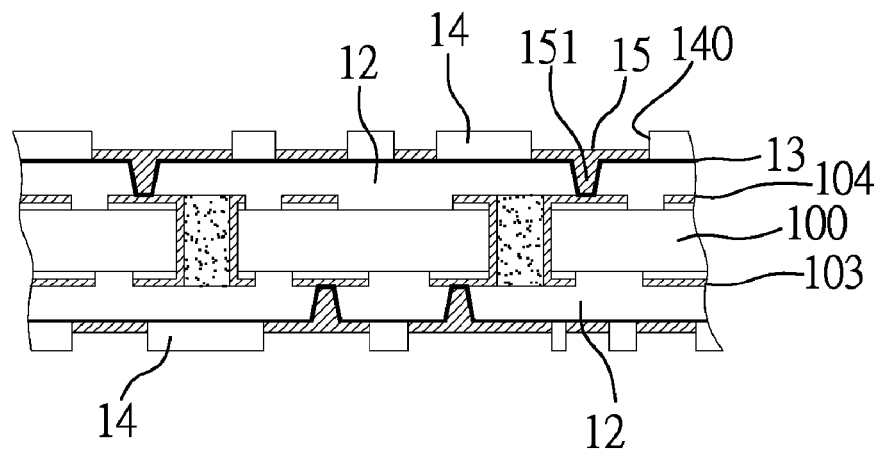
Figure 1H:
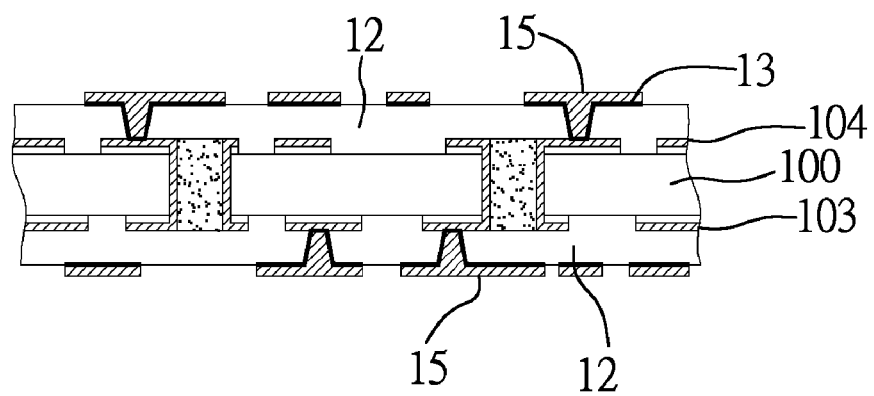
Figure 2A:
FIGS. 2A to 2R are schematic views of a circuit board structure and a fabrication method thereof in a first embodiment according to the present invention, wherein FIG. 2Q' shows another embodiment of FIG. 2Q.
Figure 2B:
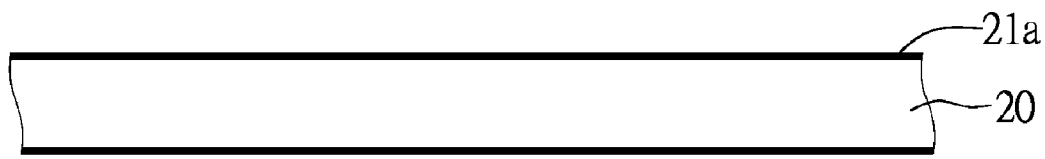
Figure 2C:
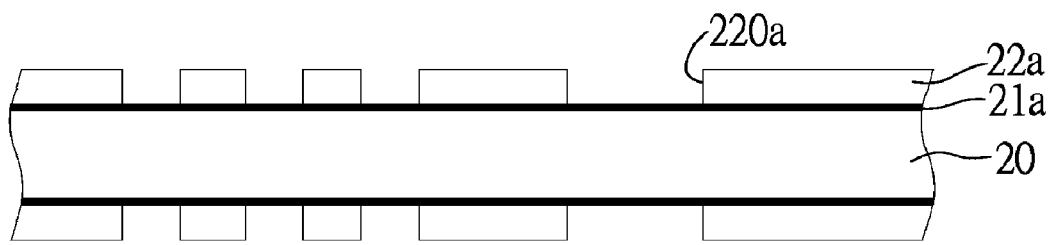
Figure 2D:
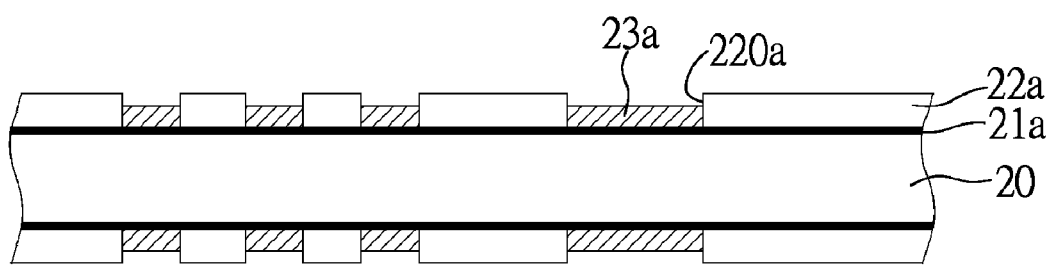
Figure 2E:
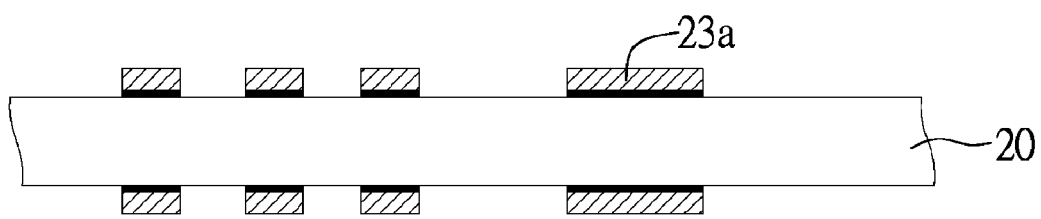
Figure 2F:
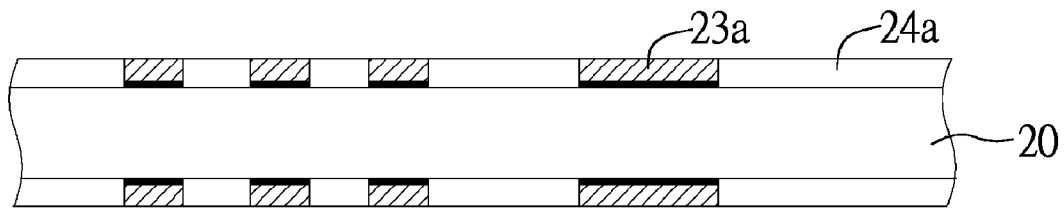
Figure 2G:
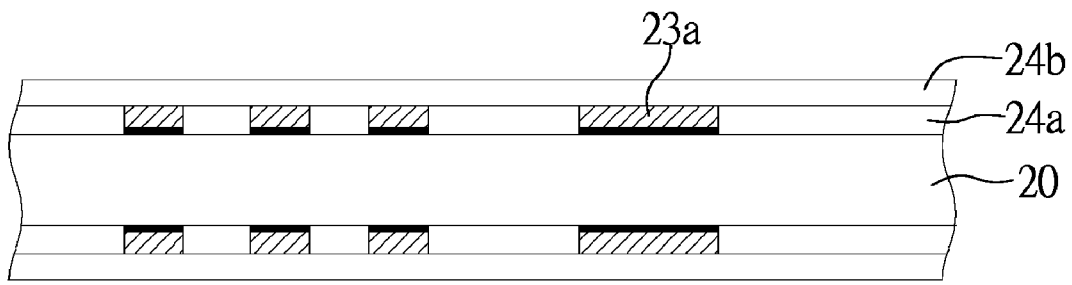
Figure 2H:
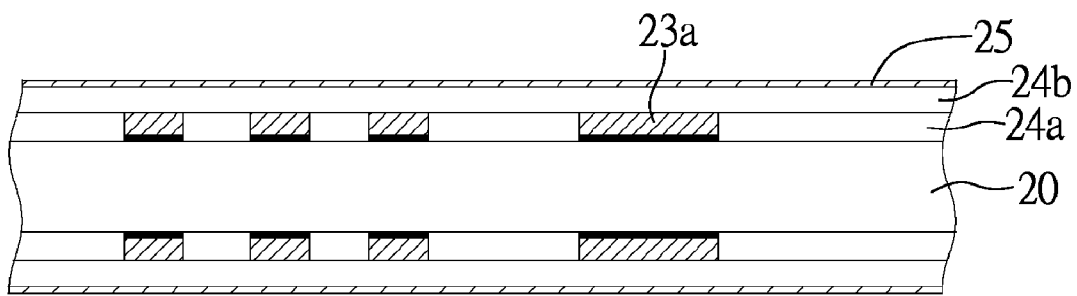
Figure 2I:
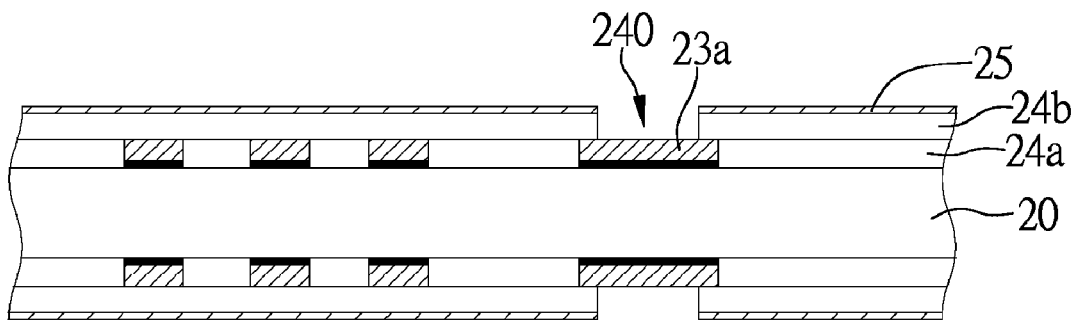
Figure 2J:
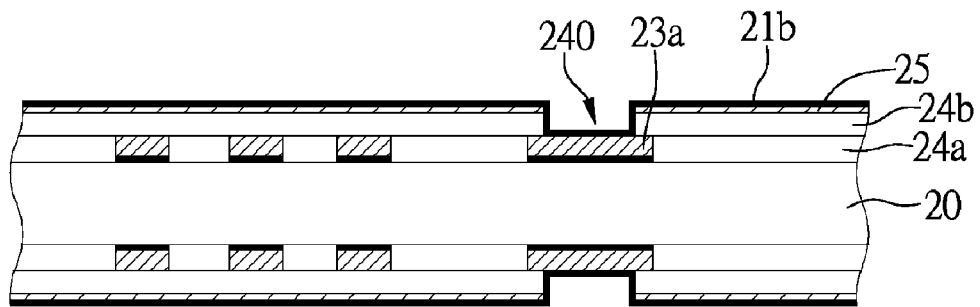
Figure 2K:
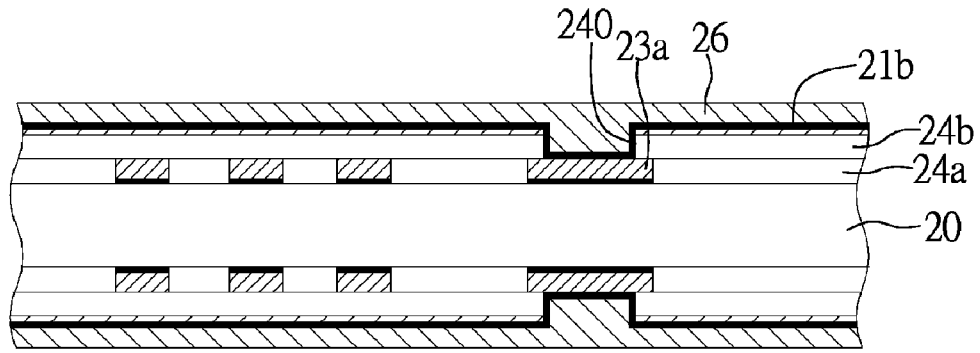
Figure 2L:
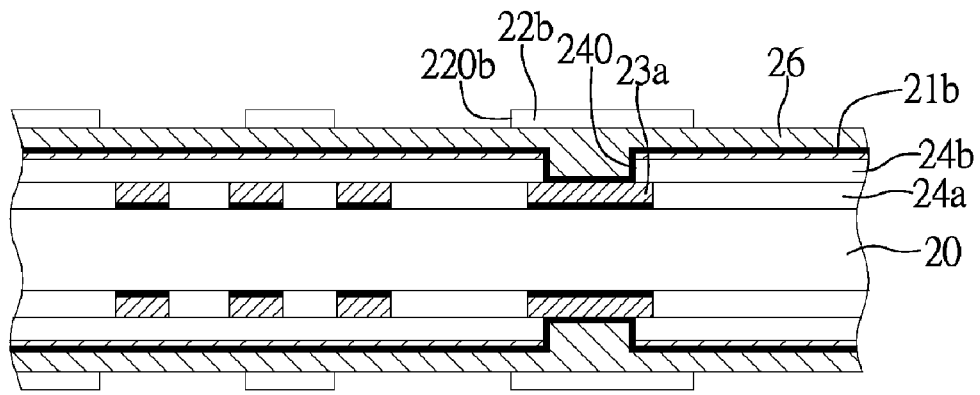
Figure 2M:
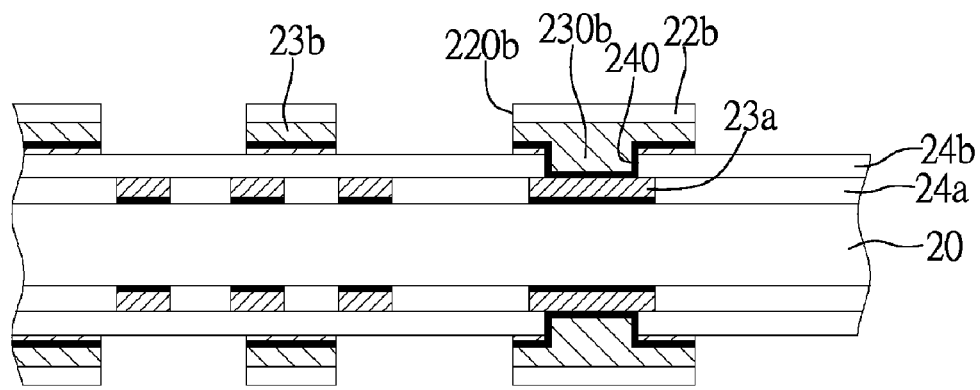
Figure 2N:
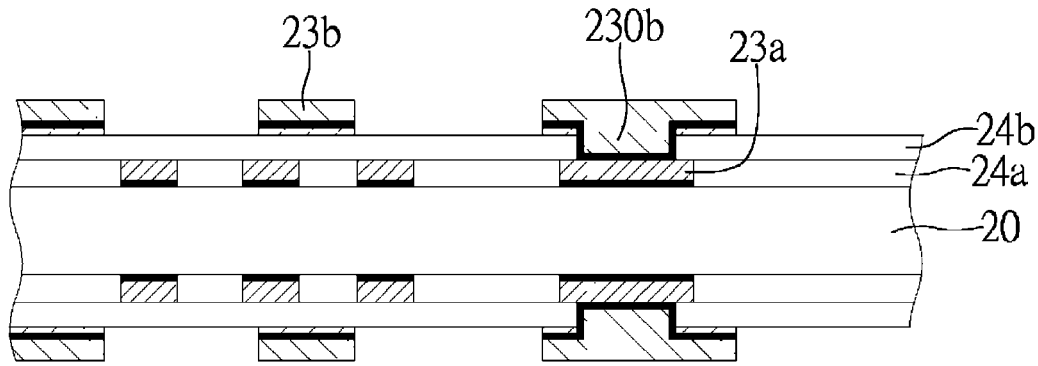
Figure 2O:
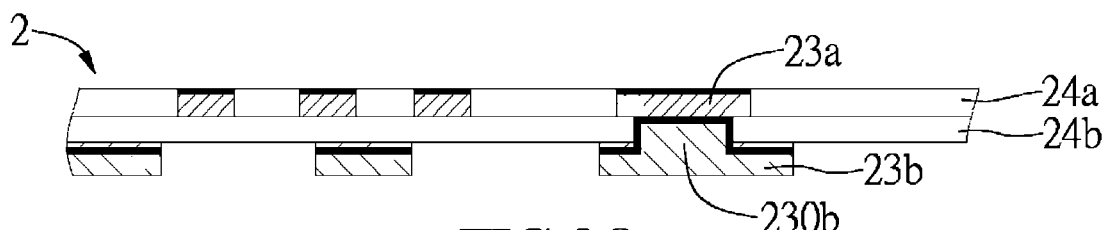
Figure 2P:
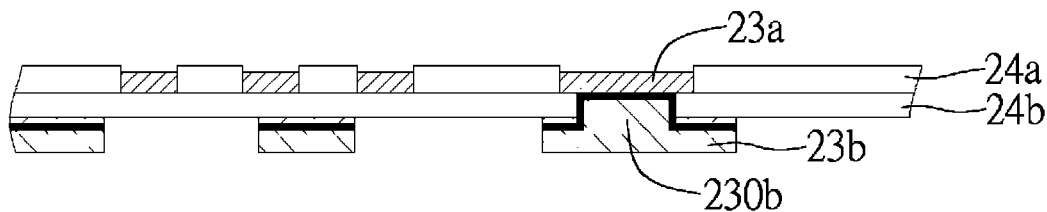
Figure 2Q:
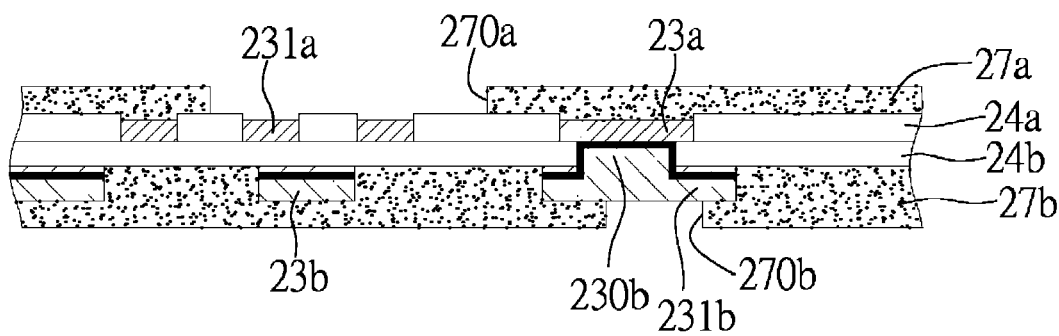
Figure 2Q:
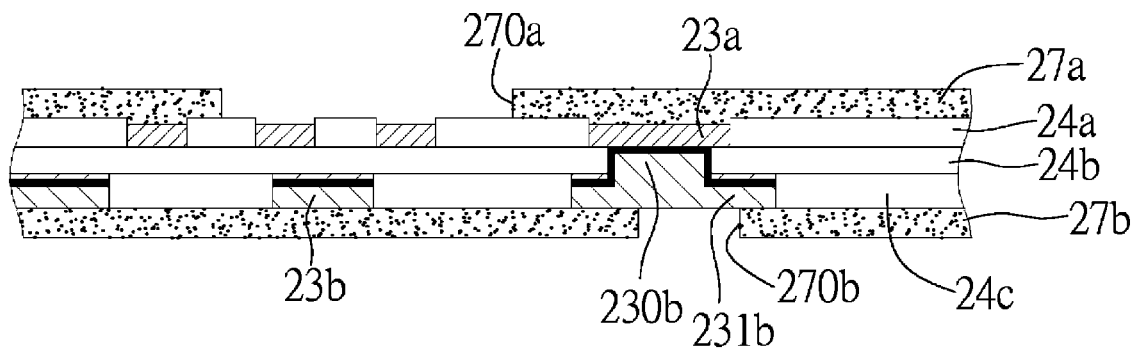
Figure 2R:
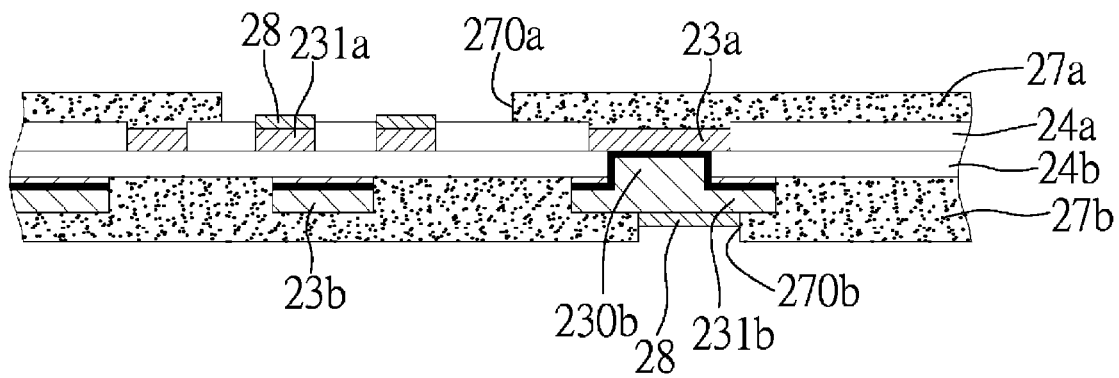

FIGS. 2A to 2R are schematic views of a circuit board structure and a fabrication method thereof in a first embodiment according to the present invention.

As shown in FIG. 2A, a carrier board 20, such as an insulating board or ceramic board, is provided.

As shown in FIG. 2B, a first conductive layer 21a is formed on the carrier board 20.

As shown in FIG. 2C, a first resist layer 22a is formed on the first conductive layer 21a, and a first opening region 220a is formed in the first resist layer 22a.

As shown in FIG. 2D, a first circuit layer 23a is formed in the first opening region 220a by an electroplating process.

As shown in FIG. 2E, the first conductive layer 21a and the first resist layer 22a thereon are removed from the carrier board 20 to expose the first circuit layer 23a and the carrier board 20.

As shown in FIG. 2F, a first dielectric layer 24a in a liquid state is formed on the carrier board 20 and the first circuit layer 23a. Hence, the first dielectric layer 24a could be stuffed into circuit gaps of the first circuit layer 23a so as to prevent interstice which may otherwise occur because of incomplete filling. Then, the first dielectric layer 24a sets slightly but does not completely harden. The first circuit layer 23a is exposed from the first dielectric layer 24a.

As shown in FIG. 2G, a second dielectric layer 24b comprising prepreg is formed on the first dielectric layer 24a and the first circuit layer 23a, then the first dielectric layer 24a is heated up until hardened such that the first dielectric layer 24a is coupled to the rough surface of the second dielectric layer 24b.

As shown in FIG. 2H, a metallic layer 25 is formed on the second dielectric layer 24b. In another embodiment, by combining the steps illustrated with FIGS. 2G and 2H, the second dielectric layer 24b made of prepreg and laminated thereto with the metallic layer 25 is formed on the first dielectric layer 24a and the first circuit layer 23a so as to simplify the fabrication process.

As shown in FIG. 2I, a plurality of vias 240 are formed to penetrate the second dielectric layer 24b and the metallic layer 25 so as to expose a portion of the first circuit layer 23a.

As shown in FIG. 2J, a second conductive layer 21b is formed on the metallic layer 25, walls of the vias 240, and the exposed portion of the first circuit layer 23a.

As shown in FIG. 2K, an electroplating metallic layer 26 is formed on the second conductive layer 21b.

As shown in FIG. 2L, a second resist layer 22b is formed on the electroplating metallic layer 26, and a plurality of second opening regions 220b are formed to penetrate the second resist layer 22b to correspondingly expose a portion of the electroplating metallic layer 26.

As shown in FIG. 2M, the electroplating metallic layer 26, the second conductive layer 21b, and the metallic layer 25 are removed from the second opening regions 220b, and the second circuit layer 23b is formed on the second dielectric layer 24b. Then, first conductive vias 230b are formed in the vias 240, respectively, so as for the second circuit layer 23b to be electrically connected to the first circuit layer 23a.

As shown in FIG. 2N, the second resist layer 22b is removed to expose the second dielectric layer 24b and the second circuit layer 23b, wherein the second circuit layer 23b is fabricated by an etching process.

As shown in FIG. 2O, the carrier board 20 is removed to divide the circuit board structure into two circuit board structures 2 so as to expose the first dielectric layer 24a and the first circuit layer 23a. The present invention is hereunder illustrated and exemplified by single said circuit board structure 2

As shown in FIG. 2P, the first conductive layer 21a is removed form the surface of the exposed first circuit layer 23a.

As shown in FIGS. 2Q and 2Q', a first solder mask 27a is formed on the first circuit layer 23a and the second dielectric layer-free side of the first dielectric layer 24a. A plurality of openings 270a are formed in the first solder mask 27a to expose portions of the first circuit layer 23a so as for the exposed portions of the first circuit layer 23a to function as a plurality of first electrical connecting pads 231a, respectively. A second solder mask 27b is formed on the second dielectric layer 24b and the second circuit layer 23b, and a plurality of openings 270b are formed in the second solder mask 27b to expose portions of the second circuit layer 23b so as for the exposed portions of the second circuit layer 23b to function as a plurality of second electrical connecting pads 231b, respectively, as shown in FIG. 2Q. In another embodiment, a third dielectric layer 24c is formed on the second dielectric layer 24b and the second circuit layer 23b, and the second circuit layer 23b is exposed from the third dielectric layer 24c. Then, a second solder mask 27b is formed on the third dielectric layer 24c and the second circuit layer 23b, and the plurality of openings 270b are formed in the second solder mask 27b to expose portions of the second circuit layer 23b so as for the exposed portions of the second circuit layer 23b to function as a plurality of second electrical connecting pads 231b, respectively, as shown in FIG. 2Q'. The present invention is hereunder illustrated and exemplified by the structure shown in FIG. 2Q.

As shown in FIG. 2R, a treatment layer 28 is formed on the first electrical connecting pads 231a and the second electrical connecting pads 231b, and the treatment layer 28 is made of tin (Sn), lead (Pb), silver (Ag), copper (Cu), zinc (Zn), bismuth (Bi), nickel (Ni), palladium (Pd), or gold (Au). The first electrical connecting pads 231a are electrically connected (not shown) to a semiconductor chip through solder bumps, or conductive wires.

The present invention further provides a circuit board structure, comprising: a first dielectric layer 24a; a first circuit layer 23a formed in the first dielectric layer 24a and exposed from the first dielectric layer; a second dielectric layer 24b formed on the first dielectric layer 24a and the first circuit layer 23a; and a second circuit layer 23b formed on the second dielectric layer 24b, wherein a plurality of first conductive vias 230b are formed in the second dielectric layer 24b so as for the second circuit layer 23b to be electrically connected to the first circuit layer 23a.

The above-described circuit board structure further comprises a first solder mask 27a formed on the first circuit layer 23a and the second dielectric layer-free side of the first dielectric layer 24a, wherein the plurality of openings 270a are formed in the first solder mask 27a to expose portions of the first circuit layer 23a so as for the exposed portions of the first circuit layer 23a to function as the plurality of first electrical connecting pads 231a, respectively. In another embodiment, a second solder mask 27b is formed on the second dielectric layer 24b and the second circuit layer 23b, and the plurality of openings 270b are formed in the second solder mask 27b to expose portions of the second circuit layer 23b so as for the exposed portions of the second circuit layer 23b to function as the plurality of second electrical connecting pads 231b, respectively.

In yet another embodiment, the third dielectric layer 24c is formed on the second dielectric layer 24b and the second circuit layer 23b, wherein the second circuit layer 23b is exposed from the third dielectric layer 24c. Then, the second solder mask 27b is formed on the third dielectric layer 24c and the second circuit layer 23b, wherein the plurality of openings 270b are formed in the second solder mask 27b to expose portions of the second circuit layer 23b so as for the exposed portions of the second circuit layer 23b to function as the plurality of second electrical connecting pads 231b, respectively.

The above-described circuit board structure further comprises a treatment layer 28 formed on the first electrical connecting pads 231a and the second electrical connecting pads 231b, and the treatment layer 28 is made of tin (Sn), lead (Pb), silver (Ag), copper (Cu), zinc (Zn), bismuth (Bi), nickel (Ni), palladium (Pd), or gold (Au).

Figure 3A:
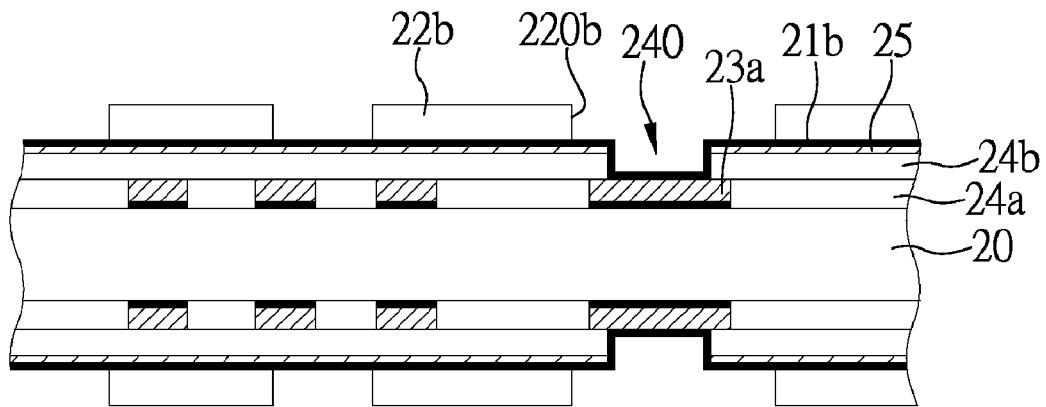
FIGS. 3A to 3C are schematic views of a circuit board structure and a fabrication method thereof in a second embodiment according to the present invention.
Figure 3B:
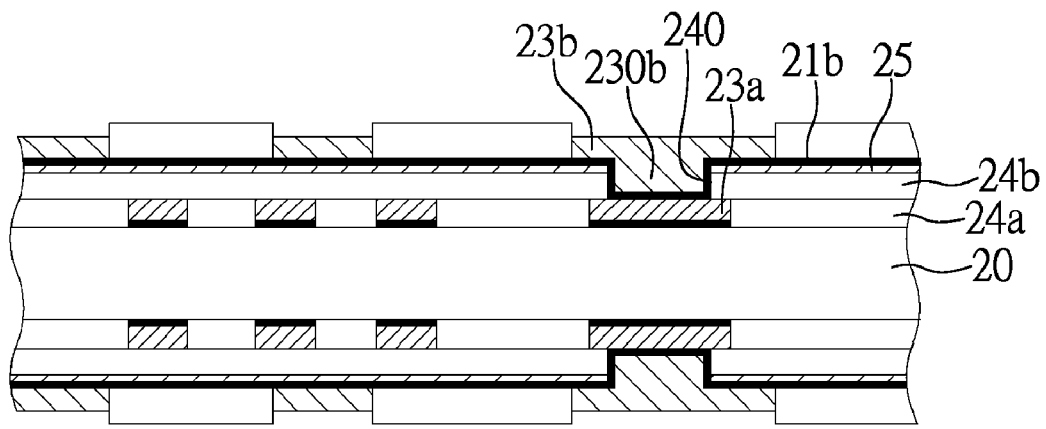
Figure 3C:
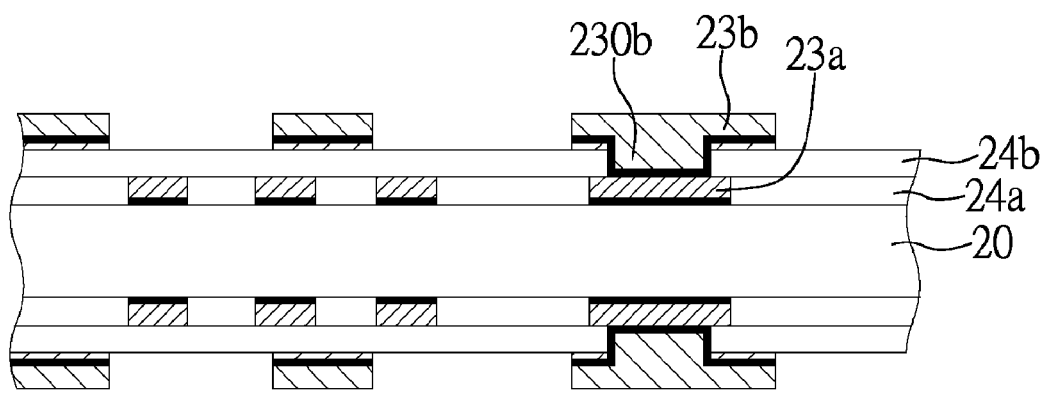

FIGS. 3A to 3C are schematic views of a fabrication method of the circuit board structure in a second embodiment according to the present invention. Unlike the first embodiment, the second circuit layer 23b of the second embodiment is fabricated by electroplating process.

As shown in FIG. 3A, the structure shown in FIG. 2J is provided first. A second resist layer 22b is formed on the second conductive layer 21b, and a plurality of second opening regions 220b are formed to penetrate the second resist layer 22b and expose portions of the second conductive layer 21b, respectively, wherein the second opening regions 220b corresponds in position to the vias 240.

As shown in FIG. 3B, a second circuit layer 23b is formed on the second conductive layer 21b in the second opening regions 220b, and a first conductive via is formed in the via 240.

As shown in FIG. 3C, the second resist layer 22b, the second conductive layer 21b and the metallic layer 25 are removed to expose the second dielectric layer 24b and the second circuit layer 23b. The subsequent steps of the method start from the disclosure in FIG. 2O and therefore are omitted for the sake of brevity.

FIGS. 4A to 4D are schematic views of a fabrication method of the circuit board structure in a third embodiment according to the present invention. Unlike the second embodiment, a build-up layer assembly in the third embodiment is formed on the second dielectric layer 24b and the second circuit layer 23b.

Figure 4A:
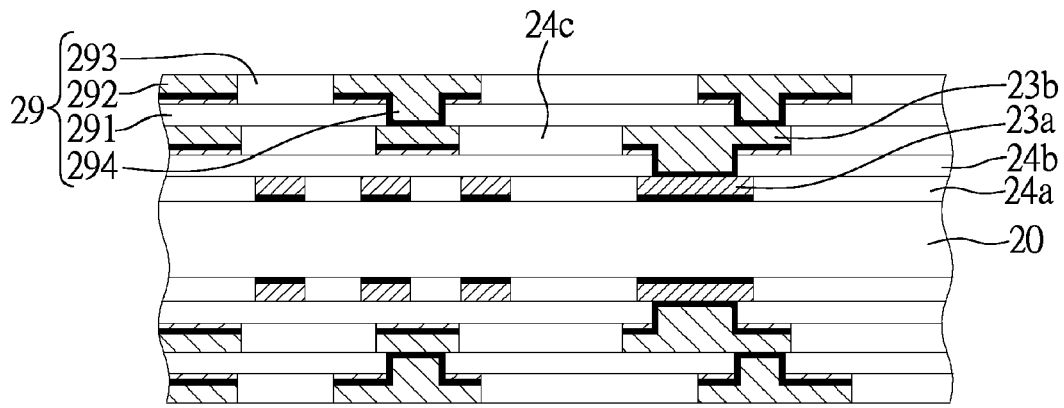
FIGS. 4A to 4D are schematic views of a circuit board structure and a fabrication method thereof in a third embodiment according to the present invention.

As shown in FIG. 4A, a circuit board such as the structure shown in FIG. 2N is provided. First, a third dielectric layer 24c is formed on the second dielectric layer 24b and the second circuit layer 23b, and expose to the second circuit layer 23b. Then, a build-up layer assembly 29 is formed on the third dielectric layer 24c and the second circuit layer 23b by the above-described etching process or electroplating process. The build-up layer assembly 29 includes at least a fourth dielectric layer 291, a third circuit layer 292 and a fifth dielectric layer 293 formed on the fourth dielectric layer 291, and a plurality of second conductive vias 294 formed in the fourth dielectric layer 291, wherein the second conductive vias 294 electrically connect to the second circuit layer 23b and the third circuit layer 292.

Figure 4B:
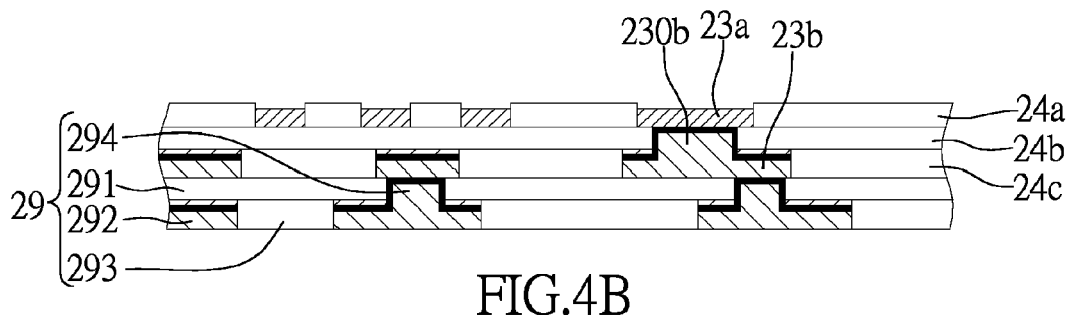

As shown in FIG. 4B, the carrier board 20 is removed to expose the first dielectric layer 24a and the first circuit layer 23a, and the first conductive layer 21a exposed on the surface of the first circuit layer 23a is removed.

Figure 4C:
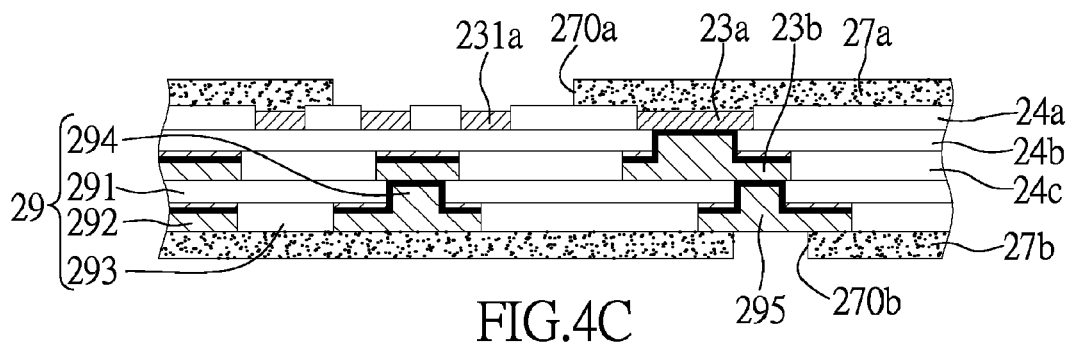

As shown in FIG. 4C, a first solder mask 27a is formed on the first circuit layer 23a and the second dielectric layer-free side of the first dielectric layer 24a, and the openings 270a are formed in the first solder mask 27a to expose a portion of the first circuit layer 23a so as to form a plurality of first electrical connecting pads 231a. A plurality of third electrical connecting pads 295 are formed on the third circuit layer 292 which is situated on the outermost part of the build-up layer assembly 29. A second solder mask 27b is formed on the outermost part of the build-up layer assembly 29. The second solder mask 27b is further formed with the openings 270b therein so as for the third electrical connecting pads 295 to be exposed from the openings 270b, respectively.

Figure 4D:
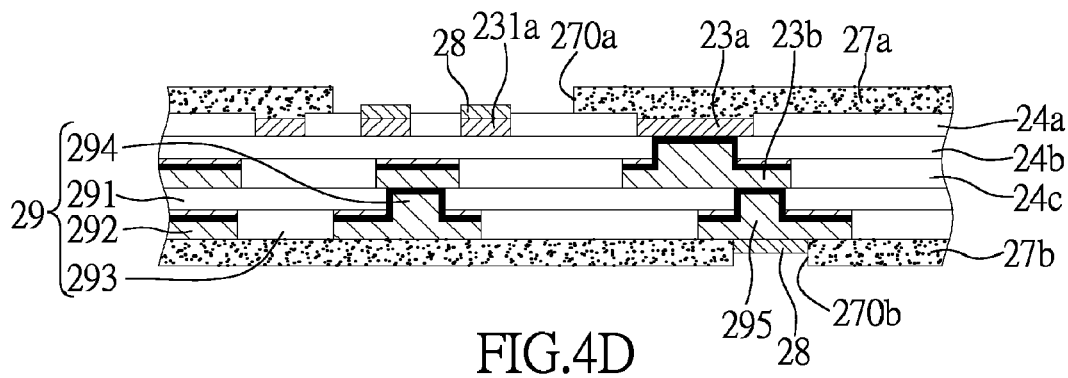

As shown in FIG. 4D, a treatment layer 28 is formed on the first electrical connecting pads 231a and the third electrical connecting pads 295, and the treatment layer 28 is made of tin (Sn), lead (Pb), silver (Ag), copper (Cu), zinc (Zn), bismuth (Bi), nickel (Ni), palladium (Pd), or gold (Au). The first electrical connecting pads 231a are electrically connected (not shown) to a semiconductor chip through solder bumps or conductive wires.

A circuit board structure of present invention is provided, which comprising: a first dielectric layer 24a; a first circuit layer 23a formed in the first dielectric layer 24a and exposed to outside; a second dielectric layer 24b formed on the first dielectric layer 24a and the first circuit layer 23a; and a second circuit layer 23b formed on the second dielectric layer 24b, wherein a plurality of first conductive vias are formed in the second dielectric layer 24b to electrically connect to the first circuit layer 23a.

In the above-described structure, a first solder mask 27a is formed on the first circuit layer 23a and the second dielectric layer-free side of the first dielectric layer 24a, wherein the openings 270a are formed in the first solder mask 27a so as to expose a portion of the first circuit layer 23a to thereby allow the exposed portion of the first circuit layer 23a to be formed into a plurality of first electrical connecting pads 231a. Then a third dielectric layer 24c is form on the second dielectric layer 24b and the second circuit layer 23b but exposes to the second circuit layer 23b. A build-up layer assembly 29 is formed on the second dielectric layer 24b and the second circuit layer 23b. The build-up layer assembly 29 includes at least a fourth dielectric layer 291, a third circuit layer 292 and a fifth dielectric layer 293 formed on the fourth dielectric layer 291, and a plurality of second conductive vias 294 formed in the fourth dielectric layer 291 and electrically connected to the second circuit layer 23b and the third circuit layer 292, wherein a plurality of third electrical connecting pads 295 are formed on the third circuit layer 292 which is situated on the outermost part of the build-up layer assembly 29. A second solder mask 27b is formed on the outermost part of the build-up layer assembly 29. The second solder mask 27b is further formed with the openings 270b therein, so as for the third electrical connecting pads 295 to be exposed from the openings 270b, respectively.

A treatment layer 28 is formed on the first electrical connecting pads 231a and the third electrical connecting pads 295, and the treatment layer 28 is made of tin (Sn), lead (Pb), silver (Ag), copper (Cu), zinc (Zn), bismuth (Bi), nickel (Ni), palladium (Pd), or gold (Au).

Therefore, the method of the present invention essentially comprises the steps of forming the first circuit layer on the upper and lower surface of the carrier board at first, next forming the liquid first dielectric layer on the carrier board with the first circuit layer, then stuffing the first dielectric layer into the gap of the first circuit layer to prevent form formation of voids, wherein the first dielectric layer exposes the first circuit layer. After that, the present invention further comprises the steps of forming a second dielectric layer on the first dielectric layer (a non-solidifying material) and the first circuit layer, then pressing the second dielectric layer composed of prepreg on the first circuit layer and the first dielectric layer to embed the rough surface of the second dielectric layer in the non-solidifying first dielectric layer, and solidifying the first dielectric layer and the second dielectric layer so as to enhance bonding strength and prevent delamination.

Afterward, the present invention further comprises the steps of forming a second circuit layer on the second dielectric layer, next forming a first conductive via in the second dielectric layer to electrically connect to the first circuit layer, then removing the carrier board to form a circuit board structure. Therefore, the circuit board structure without a known thick core occupying the conductive holes could increase the layout density and decrease thickness of the structure. Furthermore, the present invention overcomes the prior problem that it is not easy to stuff the dielectric layer composed of prepreg into the gap of the circuit layer with high layout density so as to fabricate the circuit boards with high layout density.

The above-described descriptions of the detailed embodiments are only to illustrate the preferred implementation according to the present invention, and it is not to limit the scope of the present invention. All modifications and variations completed by those with ordinary skill in the art should fall within the scope of present invention defined by the appended claims.

What is claimed is:

1. A method for fabricating a circuit board structure, comprising the steps of:
   providing a carrier board;
   forming a first circuit layer on the surface of the carrier board;
   forming a first dielectric layer on the carrier board and the first circuit layer in a manner that the first circuit layer is exposed from a surface of the first dielectric layer;
   forming a second dielectric layer on the first circuit layer and the first dielectric layer;
   forming a metallic layer on the second dielectric layer;
   forming a plurality of vias to penetrate the second dielectric layer and the metallic layer, so as for portions of the first circuit layer to be exposed from the vias, respectively;
   forming a conductive layer on the metallic layer, walls of the vias, and the exposed portions of the first circuit layer;
   forming a resist layer on the conductive layer, followed by forming a plurality of opening regions to penetrate the resist layer so as to expose correspondingly a portion of the conductive layer, wherein a portion of the opening regions corresponds in position to the vias;
   forming a second circuit layer on the conductive layer of the opening regions, and forming a first conductive via in the via so as for the second circuit layer to be electrically connected to the first circuit layer;
   removing the conductive layer, the metallic layer, and the resist layer on the conductive layer; and
   removing the carrier board so as to expose the first dielectric layer and the first circuit layer.

2. The method of claim 1, further comprising the steps of: forming a first solder mask on the first circuit layer and a second dielectric layer-free side of the first dielectric layer, and forming a plurality of openings in the first solder mask to expose a portion of the first circuit layer so as for the exposed portion of the first circuit layer to be formed into a plurality of first electrical connecting pads.

3. The method of claim 2, further comprising the step of forming on the first electrical connecting pads a treatment layer made of a metallic material selected from the group consisting of tin (Sn), lead (Pb), silver (Ag), copper (Cu), zinc (Zn), bismuth (Bi), nickel (Ni), palladium (Pd), and gold (Au).

4. The method of claim 1, further comprising the steps of: forming a third dielectric layer on surfaces of sides of the second dielectric layer and the second circuit layer, and exposing the second circuit layer from a surface of the third dielectric layer.

5. The method of claim 4, further comprising the steps of: forming a second solder mask on the third dielectric layer and the second circuit layer, and forming a plurality of openings in the second solder mask to expose a portion of the second circuit layer so as for the exposed portion of the second circuit layer to be formed into a plurality of second electrical connecting pads.

6. The method of claim 5, further comprising the step of forming on the second electrical connecting pads a treatment layer made of a metallic material selected from the group consisting of tin (Sn), lead (Pb), silver (Ag), copper (Cu), zinc (Zn), bismuth (Bi), nickel (Ni), palladium (Pd), and gold (Au).

7. The method of claim 4, further comprising the step of forming a build-up layer assembly on the third dielectric layer and the second circuit layer.

8. The method of claim 7, wherein the build-up layer assembly includes at least a fourth dielectric layer, a third circuit layer and a fifth dielectric layer formed on the fourth dielectric layer, and a plurality of second conductive vias formed in the fourth dielectric layer and electrically connected to the second circuit layer and the third circuit layer, wherein a plurality of third electrical connecting pads are formed on the third circuit layer which is situated on an outermost part of the build-up layer assembly, and a solder mask is formed on the outermost part of the build-up layer assembly and the solder mask is further formed with a plurality of openings so as for the third electrical connecting pads to be exposed from the openings, respectively.

9. The method of claim 8, further comprising the step of forming on the third electrical connecting pads a treatment layer made of a metallic material selected from the group consisting of tin (Sn), lead (Pb), silver (Ag), copper (Cu), zinc (Zn), bismuth (Bi), nickel (Ni), palladium (Pd), and gold (Au).

10. The method of claim 1, further comprising the steps of: forming a second solder mask on the second dielectric layer and the second circuit layer, and forming a plurality of openings in the second solder mask to expose a portion of the second circuit layer so as for the exposed portion of the second circuit layer to be formed into a plurality of second electrical connecting pads.

11. The method of claim 10, further comprising the step of forming on the second electrical connecting pads a treatment layer made of a metallic material selected from the group consisting of tin (Sn), lead (Pb), silver (Ag), copper (Cu), zinc (Zn), bismuth (Bi), nickel (Ni), palladium (Pd), and gold (Au).

12. The method of claim 1, wherein the step of forming the first circuit layer further comprises the sub-steps of:
    forming a first conductive layer on the carrier board;
    forming a first resist layer on the first conductive layer, followed by forming a first opening region in the first resist layer;
    forming the first circuit layer in the first opening region; and
    removing the first conductive layer and the first resist layer thereon.

13. A method for fabricating a circuit board structure, comprising the steps of:
    providing a carrier board;
    forming a first circuit layer on the surface of the carrier board;
    forming a first dielectric layer on the carrier board and the first circuit layer in a manner that the first circuit layer is exposed from a surface of the first dielectric layer;
    forming a second dielectric layer on the first circuit layer and the first dielectric layer;
    forming a metallic layer on the second dielectric layer;
    forming a plurality of vias to penetrate the second dielectric layer and the metallic layer;
    forming a conductive layer on the first circuit layer of the metallic layer, the vias and walls of the vias;
    forming an electroplating metallic layer on the conductive layer;
    forming a resist layer on the electroplating metallic layer, followed by forming a plurality of opening regions to penetrate the resist layer so as for portions of the electroplating metallic layer to be exposed from the second opening regions, respectively;
    removing the conductive layer, the metallic layer, and the electroplating metallic layer thereon in the opening regions to form a second circuit layer, and forming a first conductive via in the via so as for the second circuit layer to be electrically connected to the first circuit layer;
    removing the second resist layer; and
    removing the carrier board so as to expose the first dielectric layer and the first circuit layer.

* * * * *